United States Patent
Yang et al.

(10) Patent No.: US 8,918,685 B2
(45) Date of Patent: Dec. 23, 2014

(54) TEST CIRCUIT, MEMORY SYSTEM, AND TEST METHOD OF MEMORY SYSTEM

(75) Inventors: Hyung-Gyun Yang, Gyeonggi-do (KR); Hyung-Dong Lee, Gyeonggi-do (KR); Yong-Kee Kwon, Gyeonggi-do (KR); Young-Suk Moon, Gyeonggi-do (KR); Hong-Sik Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 164 days.

(21) Appl. No.: 13/603,597

(22) Filed: Sep. 5, 2012

(65) Prior Publication Data
US 2013/0246867 A1 Sep. 19, 2013

(30) Foreign Application Priority Data
Mar. 15, 2012 (KR) .................. 10-2012-0026508

(51) Int. Cl.
*G11C 29/00* (2006.01)
(52) U.S. Cl.
USPC ............................ 714/718; 714/733; 714/734
(58) Field of Classification Search
None
See application file for complete search history.

(56) References Cited

U.S. PATENT DOCUMENTS

| | | | |
|---|---|---|---|
| 8,572,449 B1 * | 10/2013 | Ardhanari et al. | 714/734 |
| 2005/0160333 A1 * | 7/2005 | Park | 714/718 |
| 2007/0047347 A1 * | 3/2007 | Byun et al. | 365/201 |
| 2009/0063916 A1 | 3/2009 | Vogelsang | |
| 2009/0282303 A1 * | 11/2009 | Andreev et al. | 714/718 |
| 2012/0191400 A1 * | 7/2012 | Sontakke et al. | 702/119 |

FOREIGN PATENT DOCUMENTS

KR    1020080093901    10/2008

* cited by examiner

*Primary Examiner* — John Trimmings
(74) *Attorney, Agent, or Firm* — IP & T Group LLP

(57) ABSTRACT

This technology relates to smoothly performing a test on a memory circuit having a high memory capacity while reducing the size of a test circuit. A test circuit according to the present invention includes a test execution unit configured to perform a test on a target test memory circuit, an internal storage unit configured to store data for the test execution unit, and a conversion setting unit configured to set a part of or the entire storage space of the target test memory circuit as an external storage unit for storing the data for the test execution unit.

25 Claims, 3 Drawing Sheets

TEST CIRCUIT, MEMORY SYSTEM, AND TEST METHOD OF MEMORY SYSTEM

CROSS-REFERENCE TO RELATED APPLICATIONS

The present application claims priority of Korean Patent Application No. 10-2012-0026508, filed on Mar. 15, 2012, which is incorporated herein by reference in its entirety.

BACKGROUND

1. Field

Exemplary embodiments of the present invention relate to a test circuit, a memory system, and the test method of the memory system.

2. Description of the Related Art

As the size of a semiconductor chip is reduced, demands for a technique for reducing the size of the semiconductor chip or a semiconductor package have increased. The technique for reducing the size of the semiconductor chip or the semiconductor package commonly includes a system on chip (hereinafter referred to as an SOC) technique for making several individual semiconductor devices into one semiconductor chip and a system in package (hereinafter referred to as an SIP) technique for packaging several semiconductor chips into one semiconductor package. Above techniques are also used when fabricating memory chips or memory packages.

For an efficient test on a plurality of memory circuits included in a memory chip or a memory package, there is a recent proposal for a method of including a built-in self test (BIST) circuit (hereinafter referred to as a test circuit) for testing a plurality of memory circuits, together with the plurality of memory circuits, in the memory chip or the memory package when fabricating the memory chip or the memory package by using the SOC or SIP technique.

In case of a memory chip or a memory package that includes a test circuit, test equipment externally connected to the memory chip or the memory package and a large number of ports for coupling memory circuits within the memory chip or the memory package are not necessary and the memory chip or the memory package may be rapidly tested because a test algorithm for testing the memory circuits may be embodied in the memory chip or the memory package.

Figure 1:
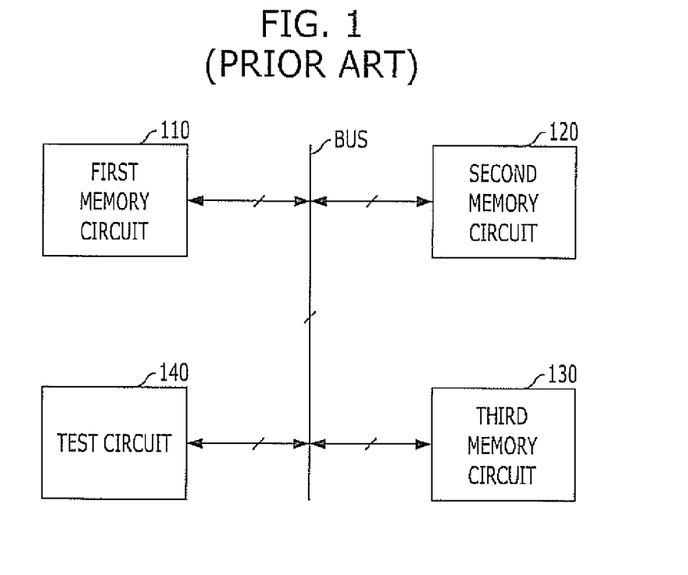
FIG. 1 shows the construction of a conventional memory system including a test circuit.

FIG. 1 shows a known memory system that includes a test circuit (shows a memory chip or a memory package that includes heterogeneous or homogeneous memory circuits).

As shown in FIG. 1, the memory system includes first to third memory circuits 110, 120, and 130 having different capacities, a test circuit 140 for testing the first to third memory circuits 110, 120, and 130, and a bus BUS for transferring signals between different elements included in the memory system. It is hereinafter assumed that the first to third memory circuits 110, 120, and 130 are heterogeneous or homogeneous. However, they have different densities and different memory capacities. The first memory circuit 110 has the lowest memory capacity, and the third memory circuit 130 has the highest memory capacity.

The known memory system is described below with reference to FIG. 1.

When a test is started, the test circuit 140 tests the first to third memory circuits 110, 120, and 130. For example, when the first memory circuit 110 is tested, the test circuit 140 supplies commands (including a read command and a write command), an address, and data that has a test pattern (hereinafter referred to as test execution information) for the test to the first memory circuit 110 through the bus BUS. The test circuit 140 receives and analyzes the output of the first memory circuit 110 through the bus BUS, and generates information indicating whether a failure has occurred in the first memory circuit 140 and indicating a fail address (hereinafter referred to as test result information) based on a result of the analysis. Here, the test circuit 140 may perform the test by using test execution information stored in a storage unit (not shown in FIG. 1) (hereinafter referred to as an embedded storage unit) embedded in the test circuit 140 and store test result information in the embedded storage unit.

In general, when a memory circuit that has a higher memory capacity is tested, the size of test execution information or test result information is increased. For this reason, the embedded storage unit of the test circuit 140 is designed to have a memory capacity so that a memory circuit that has the highest memory capacity among memory circuits to be tested by the test circuit 140 (hereinafter referred to as target test memory circuits) may be smoothly tested. For example, in case of the memory system of FIG. 1, the embedded storage unit of the test circuit 140 is designed to have a memory capacity enough to smoothly test the third memory circuit 130 not the first memory circuit 110 or the second memory circuit 120.

However, if the memory capacity of the embedded storage unit of the test circuit 140 is designed based on a memory circuit that has the highest memory capacity among target test memory circuits, the memory capacity and the area of the test circuit 140 are increased. As a result, the size of the memory system is increased.

SUMMARY

Exemplary embodiments of the present invention is directed to a test circuit, a memory system and the test method of the memory system, which reduce the size of the storage unit of a test circuit, and thus, reducing the size of the test circuit by using part of or the entire memory capacity of a target test memory circuit as the storage unit of the test circuit.

Another exemplary embodiment of the present invention is directed to a test circuit, a memory system, and the test method of the memory system, which may reduce the size of the storage unit of a test circuit and also smoothly test a memory circuit having a high memory capacity.

In accordance with an exemplary embodiment of the present invention, a test circuit according to the present invention includes a test execution unit configured to perform a test on a target test memory circuit, an internal storage unit configured to store data for the test execution unit, and a conversion setting unit configured to set a part of or the entire storage space of the target test memory circuit as an external storage unit for storing the data for the test execution unit.

In accordance with another exemplary embodiment of the present invention, a memory system includes a plurality of memory circuits, and a test circuit configured to perform a test on the plurality of memory circuits, wherein the test circuit uses some or all of storage spaces of one or more of the plurality of memory circuits as its external storage units.

In accordance with yet another exemplary embodiment of the present invention, the test method of a memory system includes checking whether or not there is a failure on a part of the storage space of a first memory circuit by testing the first memory circuit, setting a part of or an entire part of the storage space of the first memory circuit, which is not the failure, as the external storage unit of a test circuit, and performing a test on a second memory circuit having a higher memory capacity than the first memory circuit by using the external storage unit.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
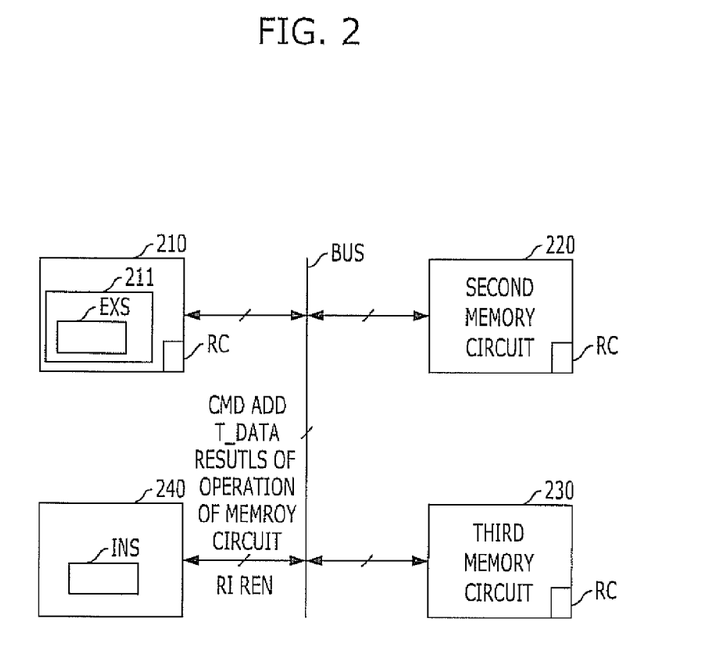
FIG. 2 shows the construction of a memory system in accordance with an embodiment of the present invention.

FIG. 2 shows the construction of a memory system in accordance with the exemplary embodiment of the present invention.

As shown in FIG. 2, the memory system includes a plurality of memory circuits 210, 220, and 230 and a test circuit 240 for testing the plurality of memory circuits 210, 220, and 230. The test circuit 240 uses a part of or the entire storage space of a memory circuit on which a test has been completed among the plurality of memory circuits 210, 220, and 230, as its external storage unit. The memory system further includes a bus BUS for transferring signals between the plurality of memory circuits 210, 220 and 230, and the test circuit 240.

The memory system in accordance with the present invention is described in detail with reference to FIG. 2.

In the memory system of FIG. 2, a plurality of memory circuits is illustrated as including the first to third memory circuits 210, 220, and 230. From the first to third memory circuits 210, 220, and 230, the first memory circuit 210 has the lowest memory capacity and the third memory circuit 230 has the highest memory capacity. That is, the first to third memory circuits 210, 220, and 230 have different memory capacities. Here, the number of memory circuits included in the memory system and the memory capacity of each of the memory circuits may be changed depending on the design.

In the memory system, when a test on the first to third memory circuits 210, 220, and 230 is started, the test circuit 240 first tests the first memory circuit 210, which has the lowest memory capacity among the first to third memory circuits 210, 220, and 230. The test operation may be started in response to an external command from the source other than the memory system or may be started in response to a command internally generated within the memory system. To test the first memory circuit 210, the test circuit 240 supplies one or more of a command CMD, an address ADD, and test pattern data T_DATA to the first memory circuit 210 through the bus BUS. The first memory circuit 210 that has received one or more of the command CMD, the address ADD, and the test pattern data T_DATA through the bus BUS performs an operation (for example, a read operation or a write operation) that corresponds to the command CMD and outputs the results of the operation (for example, an address and data).

The results outputted from the first memory circuit 210 are transferred to the test circuit 240 through the bus BUS. The test circuit 240 analyzes the received results and generates a result information RI based on a result of the analysis. The result information RI may include an information about whether the first memory circuit 210 is fail or not and an information about the address of a part with or without a failure in the first memory circuit 210. The test circuit 240 may output the generated result information RI to test equipment (not shown in FIG. 2), which is externally connected to the memory system, or may perform a repair operation for correcting the failure of the memory system based on the result information RI.

After the test on the first memory circuit 210 is completed, the test circuit 240 sets some or all of parts without a failure from the storage space 211 (it may be a cell array including a number of memory cells) of the first memory circuit 210, as an external storage unit EXS based on the result information RI. The test circuit 240 stores the addresses of the parts set as the external storage unit EXS, which are from the storage space 211 of the first memory circuit 210. The test circuit 240 stores data necessary to test the second memory circuit 220 or the third memory circuit 230 in the parts set as the external storage unit EXS from the storage space 211 of the first memory circuit 210 based on the addresses. The test circuit 240 may fetch the data necessary to test the second memory circuit 220 or the third memory circuit 230 from the external storage unit EXS and use the data to test the second memory circuit 220 or the third memory circuit 230.

The necessary data to perform the test may include data necessary to generate the command CMD, the address ADD, and the test pattern data T_DATA or may include the command CMD, the address ADD, and the test pattern data T_DATA themselves and the result information RI. The test circuit 240 includes a storage unit for storing data necessary to perform a test therein (hereinafter referred to as an internal storage unit INS). The internal storage unit INS of the test circuit 240 is designed based on the amount of data necessary to test the first memory circuit 210, which has the lowest memory capacity among the first to third memory circuits 210, 220, and 230, in order to minimize the size of the test circuit 240. Furthermore, after the test on the first memory circuit 210, which has the lowest memory capacity, is completed, the test circuit 240 sets a part of or the entire storage space 211 of the first memory circuit 210 as the external storage unit EXS and performs a test on the second memory circuit 220 or the third memory circuit 230 by using both the internal storage unit INS and the external storage unit EXS as a space for storing data necessary to perform the test.

The test circuit 240 may perform a repair operation on a target test memory circuit. The repair operation refers to an operation for storing the address of a failed part (hereinafter referred to as a fail address) from the storage space of a memory circuit so that a fail storage space is replaced with another storage space without a failure by using a redundancy circuit RC, which is included in the memory circuit.

For example, when some of the memory cells of the cell array (including a number of memory cells) of a memory circuit are failed, fail addresses are stored in a fuse. An antifuse and the fail memory cells are replaced with redundant memory cells provided for repair. In this state, when the address of a fail memory cell is supplied, a redundant memory cell that replaces the fail memory cell is accessed in response to the address.

The redundancy circuit RC includes a storage space (including a plurality of redundancy memory cells (not shown in FIG. 4) for replacing a fail storage space and a storage unit (not shown in FIG. 4) for storing a fail address in addition to a storage space (including a plurality of normal memory cells) commonly used to repair a memory circuit. Here, the storage unit may be chiefly formed of an element, such as a fuse or an anti-fuse, for maintaining stored values irrespective of the supply of power. If the storage unit is formed of a fuse, a fail address is stored in the storage unit through fuse programming for cutting the fuse by using an electrical method. If the storage unit is formed of an anti-fuse, a fail address is stored in the storage unit through anti-fuse programming for rupturing the anti-fuse. A method of storing a fail address may be performed in various ways depending on an element included in, the storage unit of the redundancy circuit RC in addition to the two methods. A description relating to the repair operation and the redundancy circuit RC is widely known in the art, and thus, a further description thereof is omitted.

When the repair operation is started, a repair enable signal REN, which indicates that the repair operation is in progress, is supplied from the test circuit 240 to a memory circuit on which the repair operation will be performed. The repair enable signal REN may be generated based on data stored in the internal storage unit INS or the external storage unit EXS. The redundancy circuit RC of the memory circuit to which the repair enable signal REN has been supplied is activated, so that it may store the address of a fail part from the storage space of the memory circuit.

Next, the test circuit 240 fetches result information RI stored in the internal storage unit INS or the external storage unit EXS. Because the result information RI includes the fail address, the test circuit 240 stores the fail address in the redundancy circuit RC of the memory circuit to be repaired. A method of storing the fail address may vary. For example, the fail address may be stored by using a method of cutting the fuse included in the redundancy circuit RC. When the repair operation is completed, the repair enable signal REN is deactivated.

The repair operation may be performed after a test operation on some or all of target test memory circuits is completed, or while a test operation on some or all of target test memory circuits is in progress. For the repair operation, a fail address must be stored in the internal storage unit INS or the external storage unit EXS. Thus, only a memory circuit on which a test operation has been completed or a part on which a test operation has been performed from the storage space of a memory circuit may be repaired.

In the above description, an example in which only a part of or the entire storage space 211 of the first memory circuit is used as the external storage unit EXS of the test circuit 240 has been described. In some embodiments, the storage space (not shown in FIG. 2) of the second memory circuit 220 or the third memory circuit 230 may be set as the external storage unit EXS of the test circuit 240 depending on the design. It is preferred that a storage space, which is checked not to have a failure, be set as the external storage unit EXS, because there is no problem in a test when the storage space without a failure is set as the external storage unit EXS.

An operation of the memory system according to the present invention is described below by taking a test for checking the fail address of a memory cell, which is included in a memory circuit, as an example.

When a test is started, the test circuit 240 supplies a write command CMD, an address ADD, and test pattern data T_DATA to the first memory circuit 210. The first memory circuit 210 stores the test pattern data T_DATA in memory cells that correspond to the address ADD. Then, the test circuit 240 supplies a read command CMD and an address ADD that correspond to the memory cells, where the test pattern data T_DATA is stored. The first memory circuit 210 outputs data stored in the memory cells that correspond to the address ADD. The test circuit 240 compares the outputted data with the test pattern data T_DATA stored in the internal storage unit INS. Also, the test circuit 240 checks whether there is a failure in the memory cells that correspond to the address ADD or not based on a result of the comparison, and stores the addresses of memory cells without a failure and result information RI indicative of the addresses of the memory cells without a failure in the internal storage unit INS.

When the test on the first memory circuit 210 is completed, the test circuit 240 sets some or all of the memory cells without a failure of the first memory circuit 210 as its own external storage unit EXS by using the addresses of the memory cells without a failure. Furthermore, the test circuit 240 stores data necessary to test the second memory circuit 220 and the third memory circuit 230 in the external storage unit EXS. For example, similar to the above-described process, the test circuit 240 tests the second memory circuit 220, generates result information RI based on the results of the test, and stores the result information RI in the external storage unit EXS.

Furthermore, while a test on each memory cell is in progress or after a test on each memory circuit is completed, the test circuit 240 performs a repair operation by using the result information RI that is stored in the internal storage unit INS or the external storage unit EXS.

The memory system in accordance with the embodiment of the present invention may be advantageous in that it may have a reduced size, because the memory capacity of the internal storage unit is minimized and a test on several memory circuits that have various memory capacities may be smoothly performed.

Figure 3:
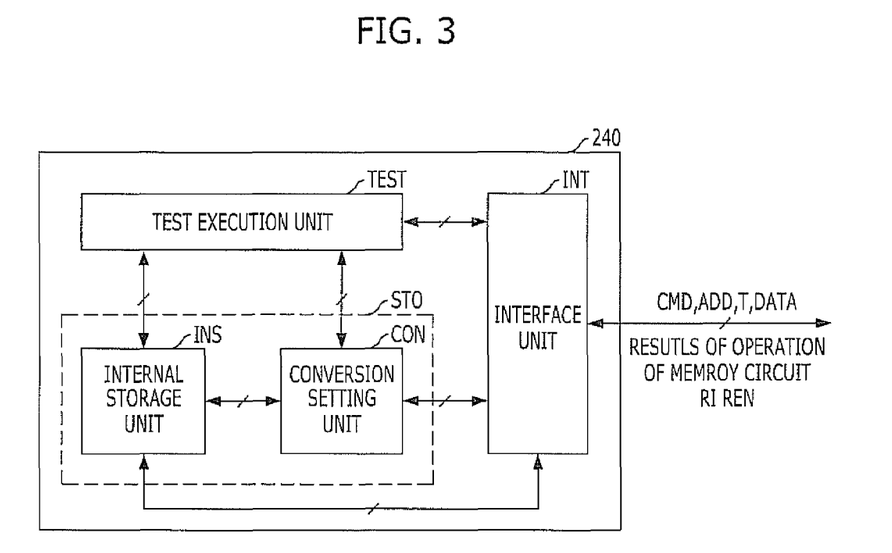
FIG. 3 shows the construction of a test circuit 240 in accordance with an embodiment of the present invention.

FIG. 3 shows the construction of the test circuit 240 in accordance with the exemplary embodiment of the present invention.

As shown in FIG. 3, the test circuit 240 includes a test execution unit TEST for performing a test on a target test memory circuit, an internal storage unit INS for storing data for the test execution unit TEST, and a conversion setting unit CON for setting a part of or the entire storage space of the target test memory circuit as an external storage unit for storing the data for the test execution unit TEST. The test circuit 240 further includes an interface unit INT, which is responsible for an interface between the elements of the test circuit 240 and the first to third memory circuits 210, 220, and 230.

The test circuit 240 according to the embodiment of the present invention is described below with reference to FIGS. 2 and 3.

As described above with reference to FIG. 2, the test circuit 240 performs a test on the target test memory circuits 210, 220, and 230. In addition, the test circuit 240 uses a storage space without a failure of a memory circuit on which the test has been performed among the target test memory circuits 210, 220, and 230 as its own external storage unit INS. A method of using the external storage unit INS is described in detail.

The test execution unit TEST performs a test on the target test memory circuits 210, 220, and 230. To perform the test, the test execution unit TEST supplies one or more of a command CMD, an address ADD, and test pattern data T_DATA to a target test memory circuit. Then, the test execution unit TEST analyzes the results of the operation of the target test memory circuit and generates the result information RI, which indicates whether there is a failure in the target test memory circuit or not, and the address of a fail part, based on a result of the analysis. The test operation on the target test memory circuit has been described above in detail with reference to FIG. 2, and thus, a detailed description thereof is omitted.

A storage unit STO stores data for the test execution unit TEST, provides the stored data to the test execution unit TEST, and stores data outputted from the test execution unit TEST. For this operation, the storage unit STO includes the internal storage unit INS, that is, a storage unit included in the test circuit 240, and the conversion setting unit CON that performs setting so that the test execution unit TEST may use the external storage unit EXS, that is, a storage unit not included in the test circuit 240.

The internal storage unit INS stores data for the test execution unit TEST. The data for the test execution unit TEST includes the command CMD, the address ADD, and the test pattern data T_DATA themselves, data necessary to generate the command CMD, the address ADD, and the test pattern data T_DATA, or result information RI. The data for the test execution unit TEST may further include data necessary for the operation of the test execution unit TEST. If data that is requested by the test execution unit TEST for the test execution unit TEST is stored in the internal storage unit INS, the internal storage unit INS transfers the requested data for the test execution unit TEST to the test execution unit TEST. Furthermore, the internal storage unit INS stores data outputted from the test execution unit TEST for the test execution unit TEST.

The conversion setting unit CON performs setting so that a part of or the entire storage space without a failure, of a target test memory circuit on which a test has been completed, among target test memory circuits, is used as the external storage unit EXS of the test circuit 240. The conversion setting unit CON receives the result information RI about a memory circuit on which a test has been completed from the test execution unit TEST, and sets a part with or the entire storage space without a failure from the storage space of the memory circuit on which the test has been completed, as the external storage unit EXS. After setting the external storage unit EXS, the conversion setting unit CON stores data for the test execution unit TEST in the external storage unit EXS. If data that is requested by the test execution unit TEST for the test execution unit TEST is set in the external storage unit EXS, the conversion setting unit CON reads the requested data from the external storage unit EXS and transfers the read data to the test execution unit TEST. If data that is requested by the test execution unit TEST for the test execution unit TEST is stored in the external storage unit EXS, the conversion setting unit CON may directly fetch the requested data from the external storage unit EXS and transfer the fetched data to the test execution unit TEST as described above or may directly transfer the requested data to the test execution unit TEST via the interface unit INT only.

The conversion setting unit CON may store the address of a part set as the external storage unit EXS of the storage space of a target test memory circuit to store data for the test execution unit TEST in the external storage unit EXS or fetch data for the test execution unit TEST stored in the external storage unit EXS. Furthermore, when storing data in the external storage unit EXS or fetching data from the external storage unit EXS, the conversion setting unit CON may use the address.

For example, if a part of or the entire part without a failure of the storage space 211 of the first memory circuit 210 is set as the external storage unit EXS, the conversion setting unit CON may store the address of the part set as the external storage unit EXS, of the storage space 211 of the first memory circuit 210, and store the address of the part set as the external storage unit EXS in the storage space 211 of the first memory circuit 210 that corresponds to an address at which data for the test execution unit TEST is stored. For another example, if data that is requested by the test execution unit TEST for the test execution unit TEST is stored in the external storage unit EXS, the conversion setting unit CON may fetch the requested data for the test execution unit TEST from the external storage unit EXS (that is, the storage space of the first memory circuit 210) by using the address of the part set as the external storage unit EXS of the storage space 211 of the first memory circuit 210 and transfer the fetched data to the test execution unit TEST.

The interface unit INT transfers data between the test execution unit TEST and the storage unit STO, that is, the elements of the test circuit 240, and the first to third memory circuits 210, 220, and 230. Data to be transferred from the test execution unit TEST or the storage unit STO to one or more of the first to third memory circuits 210, 220, and 230 is loaded onto the bus BUS via the interface unit INT from the test execution unit TEST or the storage unit STO. Furthermore, data to be transferred from one or more of the first to third memory circuits 210, 220, and 230 to the test execution unit TEST or the storage unit STO is transferred to the first to third memory circuits 210, 220, and 230 via the interface unit INT from the bus BUS.

The test execution unit TEST may perform a repair operation on a part on which a test has been performed, of the storage space of a memory circuit, by using the result information RI stored in the internal storage unit INS or the external storage unit EXS. When the repair operation is started, the test execution unit TEST supplies the repair enable signal REN to a memory circuit on which the repair operation will be performed. Furthermore, if the result information RI necessary for a repair operation is stored in the internal storage unit INS, the test execution unit TEST fetches the result information RI from the internal storage unit INS and performs the repair operation based on the fetched data. If the result information RI necessary for a repair operation is stored in the external storage unit EXS, the test execution unit TEST requests the result information RI from the conversion setting unit CON, fetches the result information RI from the external storage unit EXS, and performs the repair operation. The repair operation has been previously described in detail with reference to FIG. 2, and thus a detailed description thereof is omitted.

In the test circuit according to the present invention, a storage space set as the external storage unit EXS may be the storage space of a memory circuit that has the lowest memory capacity among one or more target test memory circuits. If the storage space of a memory circuit that has the lowest memory capacity among target test memory circuits is set as the external storage unit EXS, a test on the remaining memory circuits may be performed by using the storage space EXS of the memory circuit having the lowest memory capacity as a storage unit. In this case, the memory capacity of the internal storage unit INS may be designed based on a memory capacity necessary to perform a test on the memory circuit with the lowest memory capacity. In general, the amount of data necessary for the test execution unit TEST to test a memory circuit is proportional to the memory capacity of the memory circuit. Thus, if the memory capacity of the internal storage unit INS of the test circuit 240 is designed based on a memory circuit with the lowest memory capacity among target test memory circuits, the memory capacity of the internal storage unit INS may be minimized and the size of the internal storage unit INS may be reduced, with the result that the size of the test circuit 240 may be reduced.

Figure 4:
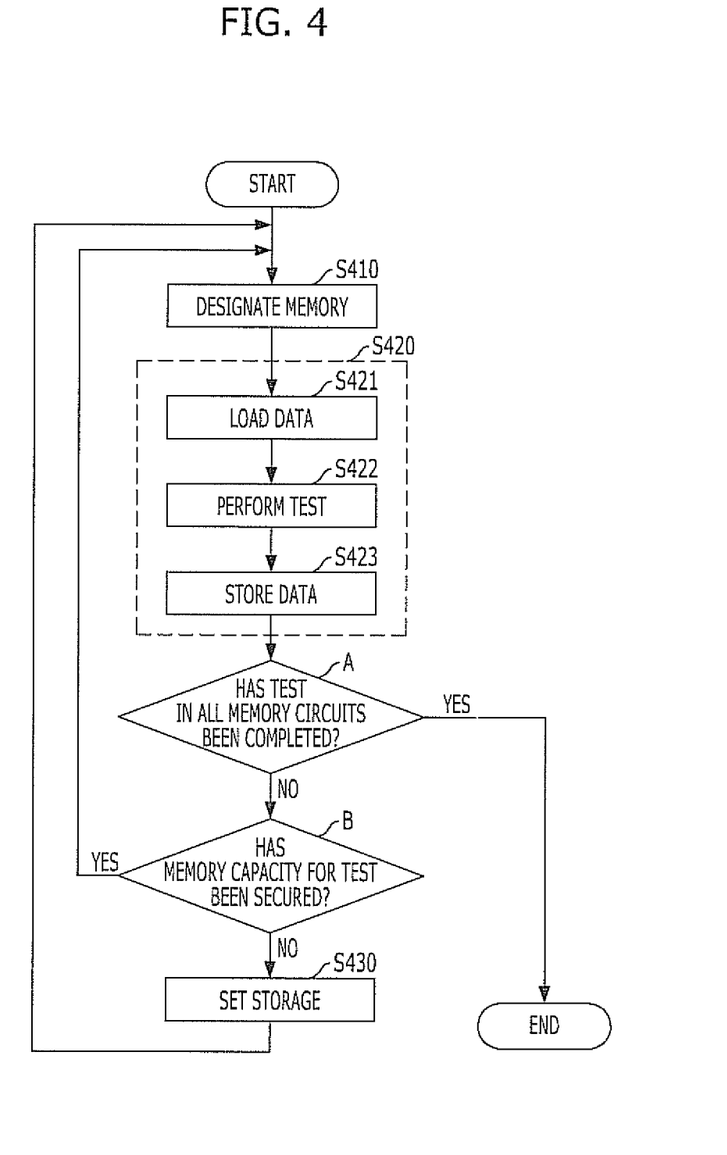
FIG. 4 is a flowchart illustrating the operation of the test circuit 240 in accordance with an embodiment of the present invention.

FIG. 4 is a flowchart illustrating the operation of the test circuit 240 in accordance with the exemplary embodiment of the present invention. The operation of FIG. 4 is performed by using some or all of the storage spaces of one or more of target test memory circuits as the storage units of the test circuit 240 when testing the one or more memory circuits by using the test circuit 240 of FIG. 3.

As shown in FIG. 4, the test method of the memory system includes checking a fail part and a part without a failure in the storage space of the first memory circuit 210 by testing the first memory circuit 210, setting a part of or the entire part without a failure of the storage space of the first memory circuit 210 as the external storage unit EXS of the test circuit 240, and performing a test on the second memory circuit 220 that has a higher memory capacity than the first memory circuit 210 by using the external storage unit EXS. The test circuit 240 includes the test execution unit TEST, the internal storage unit INS, the conversion setting unit CON, and the interface unit INT. Each of the elements of the test circuit 240 has been previously described with reference to FIGS. 2 and 3, and thus, a detailed description thereof is omitted.

The operation of the test circuit 240 is described below with reference to FIGS. 2 to 4.

When a test is started, the test execution unit TEST designates a memory circuit to be tested among one or more target test memory circuits (corresponding to the first to third memory circuits 210, 220, and 230 of FIG. 2) at step S410 (hereinafter referred to as a memory designation step). As described above with reference to FIGS. 2 and 3, the internal storage unit INS is designed based on the amount of data necessary to test a memory circuit that has the lowest memory capacity among the target test memory circuits 210, 220, and 230. Thus, in the memory designation step S410, a memory circuit that has the lowest memory capacity (corresponding to the first memory circuit 210 in FIG. 2) among the target test memory circuits 210, 220, and 230 is designated as a memory circuit on which the test will be performed. In the memory designation step S410 subsequently performed, a memory circuit of the remaining target test memory circuits on which a test has not been performed is designated as a memory circuit on which a test will be performed.

The test execution unit TEST performs the test on the designated memory circuit at step S420 (hereinafter referred to as a memory test step). The memory test step S420 includes the test execution unit TEST fetching data for the test execution unit TEST, such as a command CMD, an address ADD, and test pattern data T_DATA from the storage unit STO at step S421 (hereinafter referred to as a data loading step), the test execution unit TEST supplying one or more of the command CMD, the address ADD, and the test pattern data T_DATA to the designated memory circuit by using the fetched data for the test execution unit TEST and enabling the designated memory circuit to be operated at step S422 (hereinafter referred to as a test execution step), and the test execution unit TEST that generate the result information RI, indicating whether there is a failure in the designated memory circuit or not, and the address of the fail part or the part without a failure in the designated memory circuit, in response to the results outputted from the designated memory circuit at the test execution step S422 and storing the result information RI at step S423 (hereinafter referred to as a data storage step). The test execution step S422 and the data for the test execution unit TEST have been previously described with reference to FIGS. 2 and 3, and thus, a detailed description thereof is omitted.

In the data loading step S421, if data requested by the test execution unit TEST for the test execution unit TEST is stored in the internal storage unit INS, the data for the test execution unit TEST is transferred from the internal storage unit INS to the test execution unit TEST. If data requested by the test execution unit TEST for the test execution unit TEST is stored in the external storage unit EXS, the conversion setting unit CON of the designated memory circuit reads the data for the test execution unit TEST from the external storage unit EXS and transfers the read data to the test execution unit TEST. If the data for the test execution unit TEST is read from the external storage unit EXS, the data for the test execution unit TEST may be transferred to the test execution unit TEST via the conversion setting unit CON or may be directly transferred to the test execution unit TEST without passing through the conversion setting unit CON. However, if the external storage unit EXS has not been set, the data requested by the test execution unit TEST for the test execution unit TEST is transferred from the internal storage unit INS to the test execution unit TEST.

In the data storage step S423, the result information RI may be stored in the internal storage unit INS or the external storage unit EXS. Here, the result information RI to be stored in the external storage unit EXS may be stored in the external storage unit EXS by the conversion setting unit CON. Similar to the above description, the result information RI subsequently stored in the external storage unit EXS may be transferred to the external storage unit EXS and then stored therein via the conversion setting unit CON or may be transferred to the external storage unit EXS and then stored therein without passing through the conversion setting unit CON under the control of the conversion setting unit CON. However, if the external storage unit EXS has not been set, the result information RI is stored in the internal storage unit INS.

After the test on the designated memory circuit is completed, whether or not a test on all the memory circuits included in the one or more memory circuits 210, 220, and 230 has been completed is determined at step A. If, as a result of the determination at step A, it is determined that the test on all the memory circuits has been completed, the process proceeds to 'Yes' and the test on the memory circuits is then terminated.

If, as a result of the determination at step A, it is determined that there is any one of the memory circuits on which the test has not been completed, the process proceeds to step B in which whether or not a memory capacity has been secured to such an extent that a test on all the memory circuits may be performed is determined. If, as a result of the determination at step B, it is determined that a memory capacity has been secured to such an extent that the test on all the memory circuits may be performed, the process proceeds to step S410 in which a memory circuit to be tested is designated. If, as a result of the determination at step B, it is determined that a memory capacity has not been secured to such an extent that the test on all the memory circuits may be performed, the process proceeds to step S430. In step S430, the part of or the entire part without a failure of the storage space of the designated memory circuit on which the test has be completed is set as the external storage unit EXS, and the external storage unit EXS is used to store data for the test execution unit TEST from a test on a next memory circuit to be tested (hereinafter referred to as a storage setting step).

The determination at step B may not necessarily be a determination regarding whether a memory capacity has been secured or not, but may be a determination regarding whether a test on a memory circuit whose storage space will be set as the external storage unit EXS among target test memory circuits has been completed or not, or a determination regarding whether a test has been performed by the set number of times. For example, if the storage space of the first memory circuit 210 is reserved for the external storage unit EXS, step B may proceed to step S410 when the test on the first memory circuit is completed, but may proceed to step S430 when the test on the first memory circuit is not completed. In some embodiments, if the storage space of a memory circuit on which a test has been first completed is reserved for the external storage unit EXS, step B may proceed to step S410 when the test on the memory circuit is first completed, but may proceed to step S430 when the test on the memory circuit is not completed.

In the storage setting step S430, the address of the part of or the entire part without a failure, of the storage space of the designated memory circuit on which the test has been completed, may be stored in the conversion setting unit CON. Furthermore, the information about whether the external storage unit EXS has been set may be stored in the conversion setting unit CON. In a test performed after the storage setting step S430 is performed, data for the test execution unit TEST may be fetched from the external storage unit EXS or may be stored in the external storage unit EXS, as described above.

When the storage setting step S430 is completed, the process returns to the memory designation step S410. The memory capacity of a memory circuit, which is designated as the subject of test after the storage setting step S430 is completed, may be higher than the memory capacity of a memory circuit, which is designated as the subject of test before the storage setting step S430 is completed. A part of the storage space of a memory circuit on which a test has been completed is set as the external storage unit EXS, and the external storage unit EXS is then used when a memory circuit that has a higher memory capacity than the memory circuit on which the test has been completed is tested.

An example in which the storage space of only one memory circuit is set as the external storage unit EXS has been described above. In some embodiments, however, the storage spaces of two or more memory circuits may be set as the external storage units EXS.

The test method of the memory system may include a repair step (not shown in FIG. 4) of performing a repair operation on a part of a memory circuit on which a test has been completed. The repair step includes supplying the repair enable signal REN to the memory circuit so that the redundancy circuit RC of the memory circuit is activated when the repair operation is started, fetching the result information RI, which is generated as a result of the test on the memory circuit to be repaired from the internal storage unit INS or the external storage unit EXS, supplying a fail address to the redundancy circuit RC of the memory circuit to be repaired by using the fetched result information RI, and deactivating the repair enable signal REN when the fail address is stored in the redundancy circuit RC. The repair operation has been previously described in detail with reference to FIGS. 2 and 3, and thus, a detailed description thereof is omitted. The repair step may be performed on a part of a target test memory circuit on which a test has been completed anytime unless the test step S420 is in progress. After the repair step is completed, a step that is in progress before the repair step is started may be performed.

In the test method of the memory system according to the exemplary embodiments of the present invention, a test is performed on a memory circuit that has a low memory capacity among target test memory circuits. The part of or the entire part without a failure of the storage space of the memory circuit on which the test has been completed is set as the external storage unit EXS, and the set external storage unit EXS is used when a test on another memory circuit is performed. Accordingly, there are advantages in that the size of a test circuit may be minimized and a memory circuit that has a high memory capacity may be tested because the memory capacity of the internal storage unit INS is designed to such an extent that data necessary to perform a test on a memory circuit that has the lowest memory capacity is stored.

For reference, in FIGS. 2 and 3, the ratios and positions of the internal storage unit INS, the storage space 211, and the redundancy circuit RC that are occupied in the first to third memory circuits 210, 220, and 230 and the test circuit 240 are unrelated to the ratios and positions of actual circuits. This illustrates the internal storage unit INS, the storage space 211, the redundancy circuit RC, which are included in the first to third memory circuits 210, 220, and 230 and the test circuit 240.

In the above description, the memory circuit may be a circuit within a memory chip that has a storage space with a specific memory capacity (for example, a cell array including a number of memory cells) and performs an operation for storing data, a circuit included in a memory package or a single memory chip. The test circuit may be a circuit within a memory chip which performs a test operation on the memory circuit, a circuit included in a memory package, or a single memory chip. The memory system may be a memory chip fabricated using SOC technology or a memory package fabricated using SIP technology, but not limited thereto. For example, the memory system may be an integrated circuit that includes one or more memory circuits and one or more test circuits.

In accordance with this technology, part of or the entire memory capacity of a target test memory circuit is used as a storage unit. Accordingly, the memory capacity of a storage unit embedded in a test circuit and configured to store test information may be reduced, and thus, the size of the test circuit may be reduced.

Furthermore, in accordance with this technology, a test on a memory circuit that has a high memory capacity may be smoothly performed although a storage unit embedded in a test circuit and configured to store test information is a low memory capacity.

While the present invention has been described with respect to the specific embodiments, it will be apparent to those skilled in the art that various changes and modifications may be made without departing from the spirit and scope of the invention as defined in the following claims.

What is claimed is:

1. A test circuit comprising:
   a test execution unit configured to perform a test on a target test memory circuit;
   an internal storage unit configured to store data for the test execution unit; and
   a conversion setting unit configured to set a part of or an entire storage space of the target test memory circuit as an external storage unit for storing the data for the test execution unit.

2. The test circuit of claim 1, wherein the conversion setting unit stores the data for the test execution unit in the external storage unit, fetches the data requested by the test execution unit for the test execution unit from the external storage unit if the data for the test execution unit is stored in the external storage unit, and transfers the fetched data to the test execution unit.

3. The test circuit of claim 2, wherein the conversion setting unit stores an address of a part, which is set as the external storage unit, of the storage space of the target test memory circuit.

4. The test circuit of claim 1, wherein if the test on the target test memory circuit is completed, the conversion setting unit sets a part of the storage space of the target test memory circuit that is not failure as the external storage unit.

5. The test circuit of claim 2, wherein the test execution unit supplies one or more of a command, an address, and test pattern data to the target test memory circuit and generates result information, indicating whether there is a failure in the target test memory circuit or not and an address of a part with or without a failure in the target test memory circuit, in response to a result outputted from the target test memory circuit.

6. The test circuit of claim 5, wherein the data for the test execution unit comprises the command, the address, the test pattern data, and the result information.

7. The test circuit of claim 2, wherein the internal storage unit stores the data for the test execution unit and transfers the data requested by the test execution unit for the test execution unit to the test execution unit if the data for the test execution unit is stored in the internal storage unit.

8. The test circuit of claim 5, wherein the test execution unit performs a repair operation on the target test memory circuit by using the address of the part with a failure in the target test memory circuit which is included in the result information.

9. A memory system comprising:
a plurality of memory circuits; and
a test circuit configured to perform a test on the plurality of memory circuits,
wherein the test circuit comprises a test execution unit configured to perform the test on the plurality of memory circuits,
wherein the test circuit stores the data for the test execution unit in one or more of the plurality of memory circuits.

10. The memory system of claim 9, wherein the test for the one or more memory circuits is completed before storing the data.

11. The memory system of claim 10, wherein the test circuit further comprises
an internal storage unit configured to store data for the test execution unit.

12. The memory system of claim 11, wherein the test circuit stores the data for the test execution unit in the internal storage unit or one or more of the plurality of memory circuits.

13. The memory system of claim 12, wherein the test circuit supplies a command, an address, and a test pattern data to one or more of the plurality of memory circuits and generates a result information, indicating whether there is a failure in the one or more memory circuits or not and an address of a part with or without a failure in the one or more memory circuits, in response to a result outputted from the one or more memory circuits after the one or more memory circuits perform an operation corresponding to the command.

14. The memory system of claim 13, wherein the data for the test execution unit comprises the command, the address, the test pattern data, and the result information.

15. The memory system of claim 10, wherein the plurality of memory circuits have different memory capacities.

16. The memory system of claim 15, wherein the test circuit uses a storage space of a memory circuit having a lowest memory capacity among the plurality of memory circuits as its external storage unit.

17. The memory system of claim 16, wherein the internal storage unit has a memory capacity necessary to test the memory circuit having the lowest memory capacity.

18. The memory system of claim 13, wherein the test execution unit performs a repair operation on the memory circuit by using the address of the part with a failure in the memory circuit which is included in the result information.

19. The memory system of claim 18, wherein:
each of the plurality of memory circuits comprises a redundancy circuit, and
the test execution unit stores the address of the part with a failure in the memory circuit in the redundancy circuit if the repair operation is performed.

20. A test method of a memory system, comprising:
checking whether or not there is a failure on a part of a storage space of a first memory circuit by testing the first memory circuit, wherein the first memory circuit is tested by using a test circuit;
setting a part of or an entire part of the storage space of the first memory circuit, which is not the failure, as a storage unit for the test circuit; and
performing a test on a second memory circuit having a higher memory capacity than the first memory circuit by using the storage unit,
wherein the test circuit comprises a test execution unit configured to perform the test on the first and second memory circuits,
wherein the test circuit stores the data for the test execution unit in the storage unit.

21. The test method of claim 20, wherein the test circuit further comprises
an internal storage unit configured to store data for the test execution unit.

22. The test method of claim 21, wherein the test circuit stores the data for the test execution unit in the internal storage unit or the external storage unit.

23. The test method of claim 22, wherein the performing of the test on the first memory circuit or the second memory circuit comprises:
supplying one or more of a command, an address, and a test pattern data to a memory circuit designated as a object of test among the first memory circuit and the second memory circuit; and
generating a result information indicating whether there is a failure in the designated memory circuit or not, and an address of a part with or without a failure in the designated memory circuit, in response to a result outputted from the designated memory circuit.

24. The test method of claim 22, wherein the data for the test execution unit comprises the command, the address, the test pattern data, and the result information.

25. The test method of claim 22, further comprising performing a repair operation on the memory circuit by using the address of the part with a failure in the memory circuit which is included in the result information.

* * * * *